United States Patent [19]

Wallace

[11] Patent Number: 5,352,330
[45] Date of Patent: Oct. 4, 1994

[54] PROCESS FOR PRODUCING NANOMETER-SIZE STRUCTURES ON SURFACES USING ELECTRON BEAM INDUCED CHEMISTRY THROUGH ELECTRON STIMULATED DESORPTION

[75] Inventor: Robert M. Wallace, Dallas, Tex.

[73] Assignee: Texas Instruments Incorporated, Dallas, Tex.

[21] Appl. No.: 954,626

[22] Filed: Sep. 30, 1992

[51] Int. Cl.$^5$ ............................................. H01L 21/00
[52] U.S. Cl. ................................... 156/643; 156/635; 156/651; 156/653; 427/552; 427/596; 427/255; 437/935
[58] Field of Search ............... 156/643, 635, 651–653; 427/552, 551, 596, 255; 437/DIG. 935

[56] References Cited

U.S. PATENT DOCUMENTS

| | | | |
|---|---|---|---|
| 4,578,155 | 3/1986 | Halliwell et al. | 204/15 |
| 4,595,601 | 6/1986 | Horioka et al. | 427/53.1 |
| 4,605,566 | 8/1986 | Matsui et al. | 427/552 |
| 4,606,932 | 8/1986 | Oprysko et al. | 427/53.1 |
| 4,608,117 | 8/1986 | Ehrlich et al. | 156/610 |
| 4,612,085 | 9/1986 | Jelks et al. | 156/643 |
| 4,615,904 | 4/1985 | Ehrlich et al. | 427/38 |
| 4,624,736 | 11/1986 | Gee et al. | 156/643 |
| 4,810,601 | 3/1989 | Allen et al. | 430/18 |
| 4,834,834 | 5/1989 | Ehrlich et al. | 156/635 |
| 4,994,140 | 2/1991 | Kenzo et al. | 156/662 |
| 5,015,323 | 5/1991 | Gallagher | 156/643 |

FOREIGN PATENT DOCUMENTS

| | | |
|---|---|---|
| 62-076521 | 4/1987 | Japan . |
| 02137313 | 5/1990 | Japan . |
| 02188918 | 7/1990 | Japan . |
| 02288333 | 11/1990 | Japan . |
| 04037129 | 2/1992 | Japan . |

OTHER PUBLICATIONS

M. J. Bowden, "Forefront of Research on Resists," *Solid State Technology*, Jun. 1981, pp. 73–87.
P. Dumas, Y. J. Chabal, and G. S. Higashi, "Coupling of an Adsorbate Vibration to a Substrate Surface Phonon: H on Si(111)," *Physical Review Letters*, vol. 65, No. 9, Aug. 27, 1990, pp. 1124–1127
W. Runyun and K. Bean, *Semiconductor Integrated Circuit Processing Technology*, Addison–Wesley, New York (1990), pp. 210–211.
S. C. McNevin, "Radio Frequency Plasma Etching of Si/SiO$_2$ by Cl$_2$/O$_2$: Improvements Resulting from the Time Modulation of the Processing Gases," *J. Vac. Sci. Technol. B.* 8(6), Nov./Dec. 1990, pp. 1185–1191.
John J. Boland, "Structure of the H–Saturated Si(100) Surface," *Physical Review Letters*, vol. 65, No. 26, Dec. 24, 1990, pp. 3325–3328.
G. S. Higashi, Y. J. Chabal, G. W. Trucks, and K. Raghavachari, "Ideal Hydrogen Termination of the Si(111) Surface," *Applied Physics Letters*, 56(7), Feb. 12, 1990, pp. 656–658.
R. M. Wallace, P. A. Taylor, W. J. Choyke, and J. T. Yates, "An ESDIAD Study of Chemisorbed Hydrogen on Clean and H–Exposed Si(111)–(7×7)," *Surface Science*, Elsevier Science Publishers B.V. (North–Holland), vol. 239, 1990, pp. 1–12.
E. C. Ekwelundu and A. Ignatiev, "Electron Stimulated Desorption of Positive Ions from an Adsorbate–Covered Si(100) Surface," *Surface Science*, Elsevier Science Publishers B.V. (North–Holland Physics Publishing Division), vol. 215, 1989, pp. 91–101.

(List continued on next page.)

*Primary Examiner*—William A. Powell
*Assistant Examiner*—George Goudreau
*Attorney, Agent, or Firm*—Richard A. Stoltz; James C. Kesterson; Richard L. Donaldson

[57] ABSTRACT

The process of using electron beam induced stimulated desorption chemistry to produce structures of nanometer order size on surfaces. By passivating a reconstructed surface and selectively removing such passivation with an electron beam through the electron stimulated desorption effect, the adsorption of other atoms and/or molecules is controlled at predetermined regions and/or lines on the surface.

20 Claims, 1 Drawing Sheet

OTHER PUBLICATIONS

C. F. Corallo and G. B. Hoflund, "An Energy-Resolved, Electron14 Stimulated Desorption Study of Hydrogen from Cleaned and Oxidized Si(100)," *Surface and Interface Analysis,* Proceedings of the European Conference on Applications of Surface and Interface Analysis, vol. 12, 1988, pp. 297–302.

R. S. Becker, G. S. Higashi, Y. J. Chabal, and A. J. Becker, "Atomic Scale Conversion of clean Si(111)-:H-1×1 to Si(111)-2×1 by Electron-Stimulated Desorption," *Physical Review Letters,* vol, 65, No. 15, Oct. 8, 1990, pp. 1917–1920.

L. Clements, et al., "Adsorption and Thermal Behavior of Ethylene on Si(100)-(2×1)," *Surface Science,* Elsevier Science Publishers B.V., vol. 268, 1992, pp. 205–216.

"Modification of Hydrogen Passivated Silicon by a Scanning Tunneling Microscope Operating in Air"; Dagata et al.; Applied Phys. Lett (USA); vol. 56; No. 20; 1990; pp. 2001–2003.

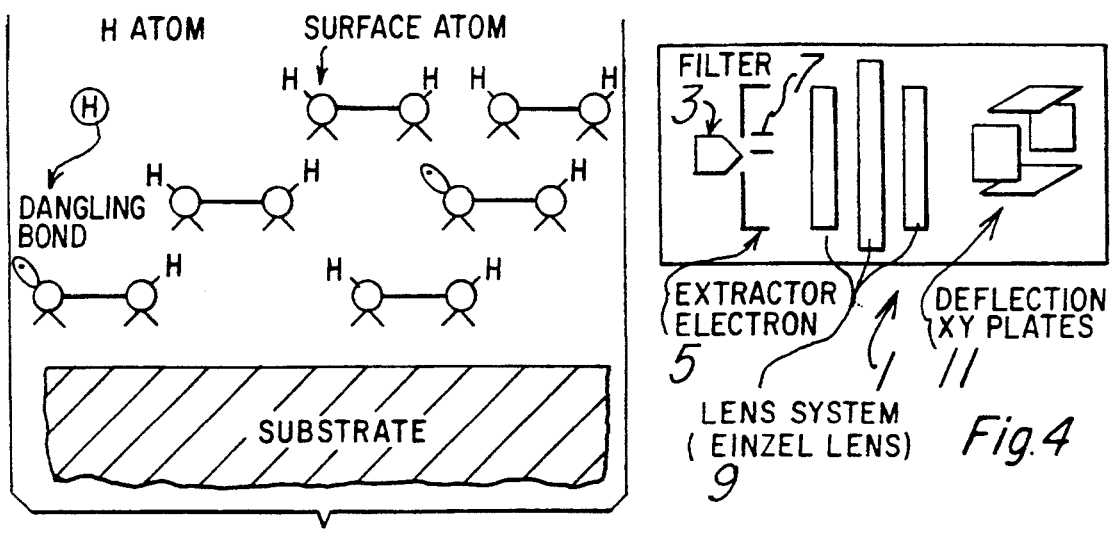
Fig.1
Fig.4
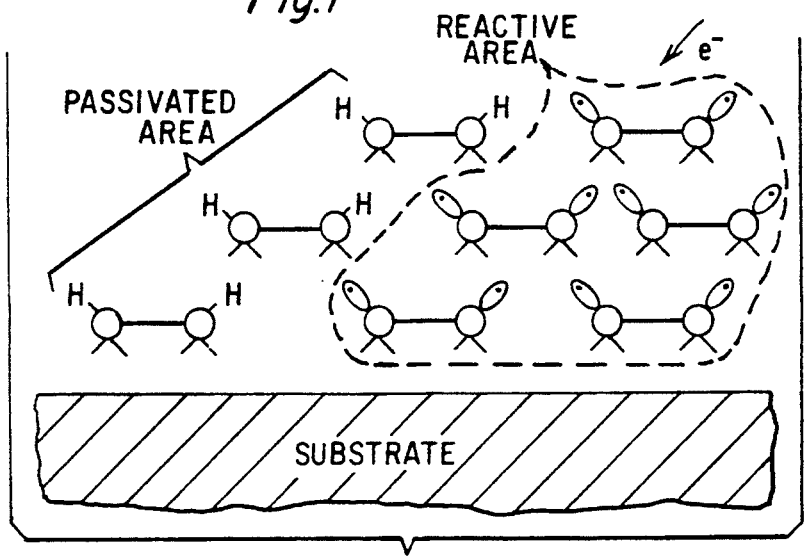
Fig.2
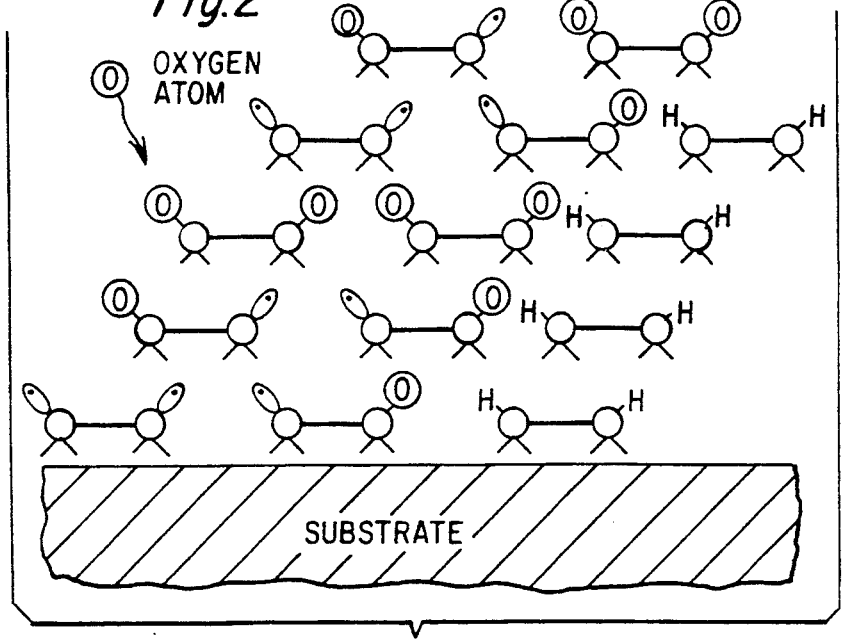
Fig.3

PROCESS FOR PRODUCING NANOMETER-SIZE STRUCTURES ON SURFACES USING ELECTRON BEAM INDUCED CHEMISTRY THROUGH ELECTRON STIMULATED DESORPTION

BACKGROUND OF THE INVENTION

1. Field of the Invention

This invention relates to the fabrication of semiconductor structures having atomic dimensions, generally in the range from an Angstrom ($10^{-10}$ meter) to a nanometer ($10^{-9}$ meter) and above and, more specifically, to fabrication of such structures using both the surface chemistry involving the atoms on the semiconductor surface and the surface reconstruction which involves the reordering of the surface atoms.

2. Brief Description of the Prior Art

The construction of sub-micron size structures for electronic devices with rapid lithographic techniques is of extreme importance for higher density semiconductor device architectures. For the ultimate semiconductor device structure, manipulation of atoms on a surface with a high degree of control and with rapid lithographic techniques is required. Current spatial resolution in photon lithography, where light is used to expose and develop a photosensitive polymer (resist), is a result of the source wavelength, the wafer-mask distance, the lens system and the spatial frequency of the object. For electron-beam resists, the spatial resolution is also limited by phenomena such as the spatial extent of secondary electron generation within the resist material. Moreover, for electron-beam lithography, a large flux of electrons may be required in the lithographic process as explained by W. Runyun and K. Bean, Semiconductor Integrated Circuit Processing Technology, Addison-Wesley, New York (1990).

The investigation of the surface chemistry of semiconductor (crystal) surfaces has been conducted for in excess of 30 years. From such work, the surface chemistry of various adsorbates with these semiconductors has been elucidated.

Semiconductor surfaces are unique in that an atomically "clean" surface has unsaturated valences ("dangling bonds") present on the surface. Such bonds, which present themselves in a well-ordered registry with the surface atoms, are thought to be highly reactive with almost any molecular/atomic species subjected to interactions with such bonds. Upon adsorption of a species to these surface dangling bonds, the chemical reactivity of the bond is reduced or "passivated". Such passivation has profound effects on the electrical performance of semiconductor devices as discussed in the above noted Runyan et al. reference and by Y. Nemirovsky, Journal of Vacuum Science Technology, A8 (1990), page 1185.

An important example of such passivation is the use of hydrogen passivated surfaces to preclude surface site reactivity on silicon single crystal surfaces. Through the use of ultra-high vacuum as discussed by J. J. Bolland in Physical Review Letters, 65 (1990), page 3325 or atmospheric wet-chemical techniques as discussed by G. S. Higashi et al. in Applied Physics Letters 56 (1990) at page 656 and P. Dumas et al. in Physical Review Letters 65 (1990) at page 1124, hydrogen passivated silicon surfaces can now be routinely prepared. Such surfaces are characterized by well-ordered arrays of passivated dangling-bonds in precise spatial registry with the surface atomic structure.

It has also been shown that adsorbed hydrogen is also sensitive to electron stimulated desorption (ESD) effects on single crystal silicon surfaces. Thus, hydrogen atoms can be deposited over the silicon surface and removed by using electron bombardment as discussed by R. M. Wallace et al., Surface Science 239 (1990) at page 1, E. C. Ekwelundu et al., Surface Science 215 (1989) at page 91 and C. F. Corallo et al., Surface Interface Anal. 12 (1988) at page 297.

Similarly, the manipulation of atoms at the surface of semiconductors has also been investigated, largely through the use of the scanning tunneling microscope. Experiments have demonstrated electron beam induced chemistry and (tip-induced) electron stimulated desorption of hydrogen from such passivated surfaces as discussed by R. S. Becker et al., Physical Review Letters 65 (1990) at page 1917. The main practical difficulty with the use of the scanning tunneling microscope approach is that the method is much too slow for a commercial manufacturing process.

It has also been shown that steric effects of impinging molecules on well-ordered semiconductor surfaces permit specific adsorbed orientations of the molecule on the surface. As an example, the adsorption of unsaturated hydrocarbons, such as ethylene, on the Si(100) surface has shown that such species prefer a specific orientation of the surface, as shown in L. Clements et al., Surface Science 268 (1992) at page 205. Such specific orientations are thought to be a result of the chemical interaction of the adsorbate with the surface dangling bond structure and are thus directly associated with the surface atomic structure. Thus, by choosing the impinging molecule for film growth and the substrate surface, which has a known surface reconstruction, one can, in principal, dictate the orientation of the film purely by surface chemistry.

SUMMARY OF THE INVENTION

In accordance with the present invention, the problems inherent in the prior art are avoided in that the well-ordered surface reconstruction of a semiconductor and the associated localized chemical reactivity is used, thus limiting the spatial resolution of the process, in principal, to atomic dimensions. The use of an electron beam permits control of the spatial area of the substrate exposed by electrostatic focussing of the beam. The current limits of electron beam diameters are generally in the nanometer range. The use of the electron stimulated desorption mechanism for species bound to the surface requires lower beam energies and currents, on the order of about 100 to about 2000 electron volts (eV). Thus, the method is faster than conventional electron beam lithography. No intermediate photosensitive polymer (resist) is required in the process, thereby avoiding degradation in the spatial resolution due to developing and molecular size of the conventional resist materials.

Briefly, by passivating a reconstructed crystalline surface and selectively removing such passivation with an electron beam through the electron stimulated desorption (ESD) effect, the adsorption of other atoms/molecules to specific regions/lines on the surface is controlled. While the invention herein is described with respect to a standard <100> crystalline silicon surface, it should be understood that any crystalline surface orientation can be used. Furthermore, while the effects described, to applicant's knowledge, have only been shown on single crystal surfaces (surfaces which exhibit a chemical reactivity with a spatial influence of nanometer or less extent) other structures can conceivably be used, such as, for example, reactivity along steps on the surface, possible reactivity along grain boundaries for polycrystalline materials and polymeric structures which exhibit reactivity once suitably prepared (for example, pre- and post-crosslinked polymers).

Assuming, for example, the use of a standard <100> crystalline silicon surface as a starting material, the surface is prepared to be atomically clean, such as, for example, by exposing the surface to HF. This both passivates the surface and cleanses the surface of oxides and organics and leaves a chemically inert surface which has been passivated with hydrogen atoms. It should be understood that other species can be used for passivation, depending upon the choice of passivating molecules, such as, for example, $NH_3$. The choice of passivation species is dictated by the surface chemistry of the adsorbate with the surface under consideration, and this may be expected to vary. Portions of the passivated surface are then selectively removed using an electron beam. The electron beam is used because the spatial extent thereof can be controlled, thereby avoiding the diffraction effects encountered with light. In is addition, the beam can be steered. The beam intensity controlled to avoid heating of the crystalline surface with concomitant removal of atoms therefrom or generation of secondary electrons. Accordingly, the electron beams utilized in accordance with the present invention are relatively low energy, generally below 2000 electron volts (eV) and as low as about 100 electron volts. The particular electron beam energy utilized in a particular case will vary in the above range, generally but not always based upon the reactivity or strength of the bonds between the atoms at the surface. For hydrogen, energies of about 500 electron volts are used. Electron beam currents are generally in the 5 nanoampere range. The atoms are accordingly desorbed (i.e., the electrons interact with the bond between the silicon and the hydrogen atoms and push the hydrogen from a state of bonding with the silicon atoms to a state of being repelled from the silicon atoms and, accordingly, repelled from the surface). The repelled hydrogen atoms combine with other hydrogen atoms and form $H_2$. Accordingly, there is now an area on the silicon surface from which passivated silicon has been selectively removed by the electron beam through the electron stimulated desorption mechanism and which is again reactive. This reactive area is now exposed to another molecular species, such as oxygen, to oxidize the reactive region, but on the order of the atomic dimensions of the electron beam in the event a silicon oxide region is to be formed. Rather than oxygen, if, for example, doping is desired, a doping composition such as phosphene, nitrogen, boron compounds, etc. is used to selectively dope a small area. This will provide doping in the previously reactive region. Accordingly, structures are fabricated having dimensions in the atomic range of generally 1 Angstrom to 1 nanometer and even above.

BRIEF DESCRIPTION OF THE DRAWINGS

FIG. 1 is a schematic diagram of a hydrogen passivated surface;

FIG. 2 is a schematic diagram of the surface of FIG. 1 after electron stimulated desorption of a portion of the passivated area to selectively remove passivating surface species;

FIG. 3 is a schematic diagram of oxidation of the regions of FIG. 2 rendered reactive by electron stimulated desorption; and FIG. 4 is a schematic diagram of an Electron Gun design for use in conjunction with the present invention.

DESCRIPTION OF THE PREFERRED EMBODIMENT

The process described herein entails the use of chemical passivation of selected surface sites, made possible by exposure to a gas phase species or a wet chemical process and the selective removal of such passivation by electron beam-induced methods, namely electron stimulated desorption.

A surface of crystalline silicon having a <100> orientation is first prepared to be atomically clean and then passivated through the adsorption of a "bond-capping" molecule, such as atomic hydrogen. The production of well-ordered passivated surfaces is provided with wet-chemical techniques, preferably by immersion in a HF bath. This process is shown in FIG. 1.

By passivating or "capping" the residual bonds at the surface, the surface is rendered chemically inert to an incoming flux of other candidate adsorption species. The species do not react with the surface and are reflected into the gas phase. This process has been directly demonstrated for a number of species on semiconductor surfaces.

With the semiconductor surface passivated with hydrogen atoms, the surface is subsequently exposed to an energetic beam of electrons, preferably having an energy of 500 electron volts with current flow of 5 nanoamperes. The electron beam must be of sufficient intensity and energy to ensure that the capping species is desorbed. The use of an electron beam permits the use of conventional electron beam lithography methods to desorb (remove) the capping species in a controlled manner. Thus, "regions" or "lines" of passivating species, hydrogen in this case, is removed, rendering such regions as reactive. This is schematically illustrated in FIG. 2. The regions of reactivity thus produced are now available for further chemical reactions with other gas-phase species. Because the passivated surface is well-ordered, the dimensions of the regions exposed to the electron beam are limited to the surface structure (reconstruction) and the width of the electron beam used.

The practical limit of such electron beam widths is on the order of 0.1 nanometer in extent, although smaller widths are possible. A limit to the beam intensity is the power injected into a small region, which results in local heating and thus possibly gives rise to thermal desorption of the capping species. Another limitation is due to the generation of secondary electrons in the substrate which is undesirable. The required low energy and low current electron beams for the ESD process avoids the power and secondary electron generation issues. An optimal electrostatic lens is required, however, to assure very small electron beam widths. When a suitable beam energy and intensity are chosen, such as set forth hereinabove, surface structures with dimensions comparable to atomic lattice spacings are constructed through the use of the surface chemistry described herein.

A simple example of the applicability of such a method is the selective oxidation of a silicon surface to provide a region of silicon oxide. In this case, the surface is cleaned and passivated as described above and subsequently exposed to a flux of oxygen atoms or molecules. Thus the regions or lines of the surface prepared as described above now consist of oxide with neighboring passivated regions. Such an example is schematically illustrated in FIG. 3. Further manipulations to produce useful structures are readily apparent.

The process described above can be used in conjunction with conventional ultrahigh vacuum growth techniques, such as molecular beam epitaxy, to include the possibility of source species which are not easily rendered in gaseous form. Thus, through the combination of the methods, a wide number of chemical compounds could be produced in films. For example, an epitaxial layer of semiconductor material can be disposed over the silicon oxide layer formed as shown in FIG. 3 with appropriate doping thereof, if desired, to form a transistor, diode or the like.

Metal-carbonyl gas-phase species, which are a source of metal atoms proposed, can be used, for example, in the construction of nanometer-size metallic regions or lines. The process would be similar to the oxidation process proposed hereinabove, namely, surface cleaning, surface passivation, selected e-beam removal of passivating species via electron stimulated desorption and deposition of metal via a host molecule. Other possible species which can provide conducting capabilities include tungsten hexafluoride for tungsten deposition, etc. Also, organic conductive polymers, such as, for example, polyacetylene, can be used in such process.

Referring now to FIG. 4, there is shown a typical structure for fabrication of structures as described hereinabove. The system includes a typical electron gun 1 having a filament 3 (or other electron source) and an extractor electrode 5 by which electrons are extracted from the filament in a tightly collimated beam 7. These electrons are focussed with a lens system 9 which can involve several lenses to shape the electron beam and guide the electron beam in a spatial manner. Many types of lens designs are known and available. A set of x-y deflection plates 11 steers the electron beam 7 onto the target which, in this case, is the crystalline silicon surface discussed above in conventional manner. The gun 1, which is an E-gun source, is designed to compress the electron beam 7 to small size on the order of a nanometer. For example, the JEOL Model 890 field emission scanning microscope which has a resolution of 0.7 nm (at 35,000 volts) and a 4 nm resolution (at 1000 volts) can be used. A conventional electron microscope using low energy of from about 100 to about 2000 electron volts can also be used as the electron gun in this case. The current flow is on the order of 5 nanoamperes.

In the event molecular beam epitaxy or other processing steps not compatible with the electron gun must be performed, the semiconductor surface can be removed from the electron gun environment and have such processing performed thereon in standard manner.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming a structure comprising the steps of:

(a) providing a surface passivated with a passivating species;
   (b) providing a controllable, energy tunable electron beam having a voltage of from 100 to 2000 eV and a current of 5 nanoamperes;
   (c) passing said controllable electron beam over selected portions of said passivated surface in a controlled manner to desorb said passivating species at said selected portions of said passivated surface to provide regions of reactivity at said selected portions of said passivated surface; and
   (d) reacting a species with said surface at said regions of reactivity to provide said desired structure.

2. The method of claim 1 wherein said surface is crystalline.

3. The method of claim 2 further including the step of atomically cleaning said surface prior to step (a).

4. The method of claim 2 further including the step of atomically cleaning said surface prior to step (a).

5. The method of claim 1 wherein said step of passivating comprises the step of adsorbing at reactive sites on said surface one of hydrogen, ammonia and nitrogen.

6. The method of claim 2 wherein said step of passivating comprises the step of adsorbing at reactive sites on said surface one of hydrogen, ammonia and nitrogen.

7. The method of claim 3 wherein said step of passivating comprises the step of adsorbing at reactive sites on said surface one of hydrogen, ammonia and nitrogen.

8. The method of claim 4 wherein said step of passivating comprises the step of adsorbing at reactive sites on said surface one of hydrogen, ammonia and nitrogen.

9. The method of claim 1 wherein said surface is a semiconductor surface and said species is taken from the class consisting of semiconductor dopants.

10. The method of claim 2 wherein said surface is a semiconductor surface and said species is taken from the class consisting of semiconductor dopants.

11. The method of claim 4 wherein said surface is a semiconductor surface and said species is taken from the class consisting of semiconductor dopants.

12. The method of claim 8 wherein said surface is a semiconductor surface and said species is taken from the class consisting of semiconductor dopants.

13. The method of claim 1 wherein said surface is a semiconductor surface and said species is taken from the class consisting of metal-carbonyl gas species and tungsten hexafluoride.

14. The method of claim 2 wherein said surface is a semiconductor surface and said species is taken from the class consisting of metal-carbonyl gas species and tungsten hexafluoride.

15. The method of claim 4 wherein said surface is a semiconductor surface and said species is taken from the class consisting of metal-carbonyl gas species and tungsten hexafluoride.

16. The method of claim 8 wherein said surface is a semiconductor surface and said species is taken from the class consisting of metal-carbonyl gas species and tungsten hexafluoride.

17. The method of claim 1 wherein the width of said electron beam is up to 0.1 nanometer.

18. The method of claim 2 wherein the width of said electron beam is up to 0.1 nanometer.

19. The method of claim 9 wherein the width of said electron beam is up to 0.1 nanometer.

20. The method of claim 10 wherein the width of said electron beam is up to 0.1 nanometer.

* * * * *